United States Patent [19]
Kostelnik et al.

[11] Patent Number: 5,909,150
[45] Date of Patent: Jun. 1, 1999

[54] SYSTEM AND METHOD FOR IMPROVING THE REGULATION OF A SUPPLY VOLTAGE FOR A CONTROLLABLE OSCILLATOR USING FEED FORWARD CONTROL TECHNIQUES

[75] Inventors: Matthew M. Kostelnik; David M. Pietruszynski, both of Austin, Tex.

[73] Assignee: Cirrus Logic, Inc., Fremont, Calif.

[21] Appl. No.: 08/956,596

[22] Filed: Oct. 23, 1997

[51] Int. Cl.[6] .............................. H03B 5/04; H03B 5/24; H03L 7/099
[52] U.S. Cl. .................................. 331/34; 331/8; 331/17; 331/177 R; 331/185; 331/186; 327/156; 360/51
[58] Field of Search ...................................... 331/34, 36 C, 331/177 R, 179, 177 V, 185, 186, 17, 25, 8; 327/156–159; 360/51

[56] References Cited

U.S. PATENT DOCUMENTS

| | | | |
|---|---|---|---|
| 5,075,643 | 12/1991 | Einbinder | 332/135 |
| 5,097,228 | 3/1992 | McJunkin | 331/185 X |
| 5,485,126 | 1/1996 | Gersbach et al. | 331/57 |
| 5,559,476 | 9/1996 | Zhang et al. | 331/57 |
| 5,604,466 | 2/1997 | Dreps et al. | 331/113 |
| 5,714,912 | 2/1998 | Fiedler et al. | 331/57 |

*Primary Examiner*—David Mis
*Attorney, Agent, or Firm*—Richard D. Egan; Dan A. Shifrin

[57] ABSTRACT

A system and method for regulating the voltage at an input node of a varying current demand circuit is provided. The input node may be a power supply node and the varying current demand circuit may be a controllable oscillator. In addition, a frequency synthesizer may be formed from a phase locked loop which includes the controllable oscillator and a voltage control circuit. The voltage control circuit may receive an input control signal that varies as the current demand of the controllable oscillator varies. In response to the input control signal, the voltage control circuit may provide a more stable voltage supply to the controllable oscillator even as the current demands of the oscillator vary widely. The input control signal may be generated by generating a signal from the loop path of the phase locked loop. The frequency synthesizer may be utilized in a data storage system data detection circuit, such as for example, a data detection circuit used for recovering data from an optical disk.

35 Claims, 8 Drawing Sheets

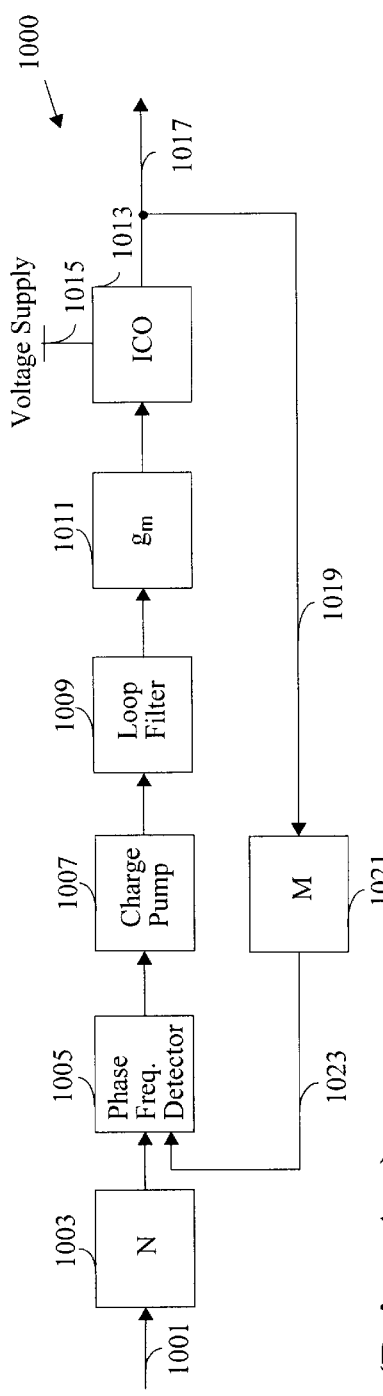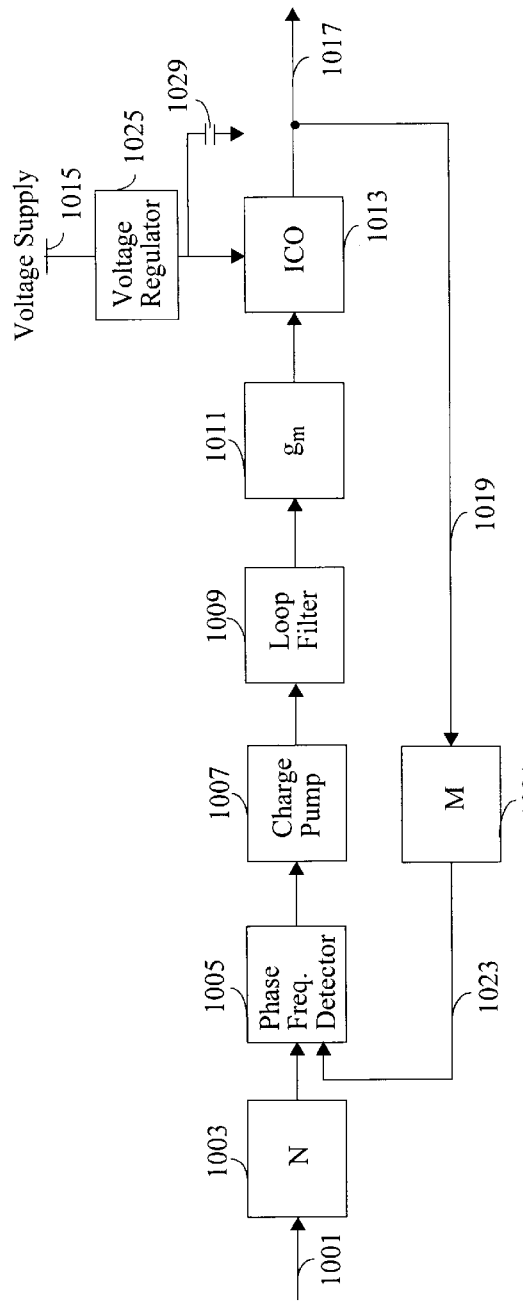
Fig. 1 (Prior Art)
Fig. 1A (Prior Art)

SYSTEM AND METHOD FOR IMPROVING THE REGULATION OF A SUPPLY VOLTAGE FOR A CONTROLLABLE OSCILLATOR USING FEED FORWARD CONTROL TECHNIQUES

BACKGROUND OF INVENTION

1. Field of the Invention

The present invention relates to the controllable oscillators, and more particularly, regulation of a supply voltage for a controllable oscillator of a frequently synthesizer utilized in data detection circuits such as, for example, data detection circuits used with optical data disks.

2. Description of Related Art

In many data detection circuits an electrical signal is received from a data storage media, such as a CD-ROM, DVD, or other optical disk, magnetic hard disk, magnetic tape etc. In the case of optical disks, the electrical signal is generated from light that is reflected off an optical disk and converted to electrical pulses. The electrical pulses may then be transmitted to a data detection circuit for further signal processing to recover the data in a useable form. Data detection circuits may also be combined with circuitry for write operations. For example, circuitry for both read and write operations may be combined read/write channel circuits utilized with magnetic hard disks. In contrast, some optical disks are utilized in read only systems and thus the data detection circuit need not be combined with write circuitry. In general both read only and read/write data detection circuits may also include servo circuitry.

No matter what type of data storage media or data detection circuitry is utilized, a frequency synthesizer is often utilized to generate a clock signal for various circuit elements within the data detection or data write circuitry. For example, the continuous electrical pulse from an optical disk is generally converted into a discrete sample sequence by sampling the electrical pulses with an analog to digital converter (ADC) which may be clocked by the frequency synthesizer. Typically, the frequency synthesizer includes a phase locked loop (PLL). As shown in FIG. 1, a frequency synthesizer 1000 may be a phase locked loop (PLL) which may include a current controlled oscillator (ICO) 1013 and a reference clock input signal 1001. The phase locking loop is completed by feeding back the output of the oscillator to a phase/frequency detector which also receives the reference clock signal. More particularly, the reference clock 1001 is provided to a divider circuit 1003 which divides the reference clock signal by a value of N. The output of the divider 1003 is provided as one input to the phase/frequency detector 1005. The output of the phase/frequency detector is provided to a charge pump 1007 which in turn provides an output to a loop filter 1009. The voltage output of the loop filter 1009 is provided to transconductance stage 1011 which converts the voltage output of the loop filter to a current output. The transconductance stage 1011 has an output which is provided to the current controlled oscillator 1013. The current controlled oscillator may receive a voltage supply 1015. The output 1017 of the current controlled oscillator 1013 is provided as an output clock and also utilized in a feedback loop which is provided to the divider 1021 which divides the output 1017 by M. The output 1023 of the divider 1021 is then provided as the second input to the phase/frequency detector 1005. The M and N values may be called the PLL loop divisors since the output frequency at the PLL output 1017 is $F_S$, and is given by $$F = (M/N) F_{REF}$$

where $F_{REF}$ is the reference clock frequency which may be typically provided from a crystal oscillator.

A frequency synthesizer such as shown in FIG. 1 is often sensitive to phase noise and jitter introduced at the current controlled oscillator. One factor which impacts the phase noise and jitter of the current controlled oscillator is the noise of the voltage supply 1015. Noise in the voltage supply will change the oscillation rate of the current controlled oscillator and inject phase noise in the phase locked loop output. In order to limit the impact of voltage supply noise, voltage regulators have been added between the voltage supply and the current controlled oscillator. For example, as shown in FIG. 1A, a voltage regulator circuit 1025 and capacitor 1029 may be coupled to the power supply input node 1027 of the current controlled oscillator 1013. However, it has been desirable to obtain improved voltage regulation over that obtained by use of a voltage regulator. In particular, it has been noted that the current demands drawn by the oscillator from the power supply may vary greatly and these large current demands tend to degrade the regulation performance of the voltage regulator which in turns degrades the performance of the current controlled oscillator. Thus, it would be desirable to provide an improved frequency synthesizer having an improved voltage regulation for the current controlled oscillator to improve noise and frequency jitter performance. Furthermore, it would be desirable to obtain such improved performance while utilizing a less complex voltage regulator.

SUMMARY OF INVENTION

The problems and difficulties described above may be addressed by use of all or part of the oscillator voltage supply regulation techniques disclosed herein. More particularly, a system and method for regulating the voltage at a node of a varying current demand circuit is provided. The node may be a power supply node and the varying current demand circuit may be a controllable oscillator. In addition, a frequency synthesizer may be formed from a phase locked loop which includes the controllable oscillator and a voltage control circuit. The voltage control circuit may receive an input control signal that varies as the current demand of the controllable oscillator varies. In response to the input control signal, the voltage control circuit may provide a more stable voltage supply to the controllable oscillator even as the current demands of the oscillator vary widely. The voltage control circuit may operate so as to add or remove current from the supply node in an amount approximately equal to the current demand changes of the controllable oscillator. Thus, a voltage regulator within the voltage control circuit may be operated at a relatively constant current. The input control signal may be generated by obtaining a signal from the loop path of the phase locked loop. The frequency synthesizer may be utilized in a data storage system data detection circuit, such as for example, a data detection circuit used for recovering data from an optical disk.

In one embodiment, a method of operating a data detection circuit is provided. The method may comprise generating a clock signal from a frequency synthesizer. The frequency synthesizer may include a phase locked loop having a controllable oscillator. The method may also comprise coupling the controllable oscillator to a power supply node, controlling the power supply node with a power supply control circuit, and providing a control signal from the phase locked loop to the power supply control circuit.

In another embodiment of the present invention, a method of operating a data storage system comprises transmitting a data signal from a data storage medium to a data detection circuit, generating, within the data detection circuit, a clock signal from a phase locked loop. The phase locked loop may include a controllable oscillator. The method also comprises providing a power supply to the controllable oscillator, controlling the power supply with a feed forward control signal from the phase locked loop so as to regulate the power supply and to provide a more accurate clock signal, and processing the data signal with at least one circuit within the data detection circuit, the at least one circuit being clocked by the clock signal.

In yet another embodiment, a method of operating a frequency synthesizer is provided. The method comprises forming a phase locked loop and regulating a power supply provided to a controllable oscillator of the phase locked loop. The method also comprises generating a power supply control signal from the phase locked loop, and adjusting the regulation of the power supply with the control signal.

In another embodiment, a method of operating a circuit, the circuit having a varying current demand at a voltage supply node is provided. The method may included coupling the circuit to the voltage supply node, and generating within the circuit a varying current demand at the voltage node wherein the varying current demand depends upon a first circuit control signal. The method also may include controlling the voltage at the voltage supply node with a voltage supply control circuit, providing a feed forward control signal to the voltage control circuit wherein the feed forward control signal bears a relationship to the first circuit control signal. The method may further includes controlling the voltage supply control circuit with the feed forward control signal.

The present invention may also include a data detection circuit for processing data from a data storage medium. The data detection circuit may have a phase locked loop and a clock signal generated by the phase locked loop wherein the clock signal is utilized to clock at least one circuit of the data detection circuit. The data detection circuit may further include a controllable oscillator within the phase locked loop, a power supply node coupled to the controllable oscillator, a power supply control circuit coupled to the power supply node, and a control signal generated from the phase locked loop, the control signal coupled to the power supply circuit.

The present invention may also include a frequency synthesizer. The frequency synthesizer may comprise a phase locked loop and a controllable oscillator within the phase locked loop, an output of the controllable oscillator providing the phase locked loop output. The frequency synthesizer may also comprise a first control signal coupled to the controllable oscillator for controlling the controllable oscillator, a power supply node coupled to the controllable oscillator, and a power supply control circuit coupled to the power supply node. A power supply control signal generated from the phase locked loop is also provided. The power supply control signal may be representative of the first control signal.

BRIEF DESCRIPTION OF THE DRAWINGS

It is to be noted that the appended drawings illustrate only particular embodiments of the invention and are, therefore, not to be considered limiting of its scope, for the invention may include other effective embodiments.

FIGS. 1 and 1A are block diagrams of prior art frequency synthesizers.

DETAILED DESCRIPTION OF THE INVENTION

Figure 2:
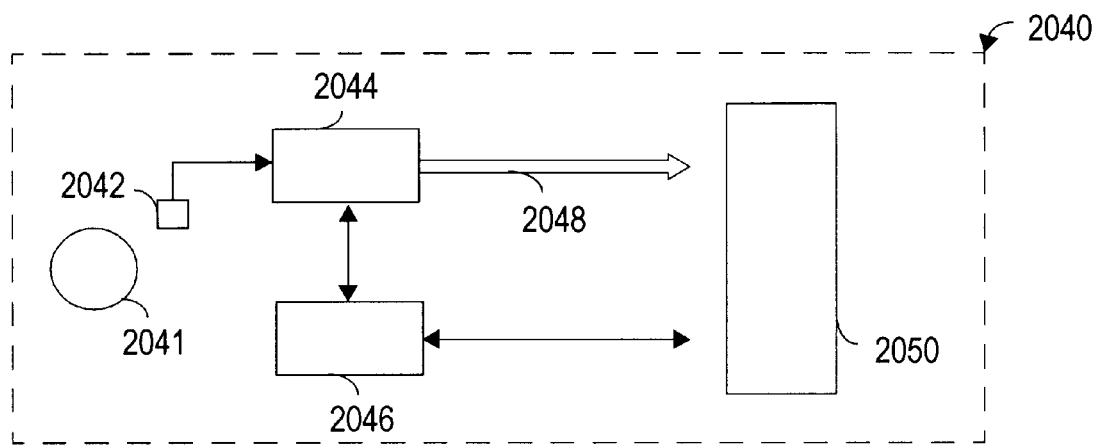
FIG. 2 is a block diagram of an optical disk data storage system.

FIG. 2 illustrates a data storage system 2040 in which the present invention may be utilized. The data storage system may include a disk 2041 and a read head 2042. In one embodiment, the disk 2041 may be an optical disk such as a CD-ROM or a DVD disk and the read head 2042 may be an optical pickup such as holographic or astigmatic heads which utilize photodiode arrays to convert optical signals to electrical signals. Coupled to the read head 2042 is a data detection circuit 2044. As shown, a data detection circuit may include read circuitry, servo circuitry, and other circuitry. In the case of an optical storage system, the data detection circuit 2044 may be a DVD/CD-ROM DSP (Digital Signal Processor) and decoder circuit compatible with industry interface standards such as the standard IDE/ ATA interface and more specifically the ATAPI (AT Attachment Packet Interface) interface. A local microcontroller 2046 may be coupled to the data detection circuit 2044. The microcontroller 2046 and the data detection circuit 2044 may also be coupled to a host computer 2050. The data detection circuit 2044 may be coupled to the host computer through a portion of the host computer's ATA bus 2048. The optical disk, pickup head, microcontroller, and host computer may be any of a wide variety of commercially available components.

The data storage system 2040 shown in FIG. 2 is just one illustrative example of a data storage system. Other data storage systems may also utilize the present invention. For example, magnetic disk drive systems utilizing a read channel circuit as a data detection circuit may also utilize the present invention. Further, though shown separately, various components of the data storage system may be combined or additional components may be considered to be part of the system including components such as RAM, ROM, power supply circuits, servo circuitry, and other circuits. In addition, though shown as separate from the host computer, the data storage system may be integrally formed within a computer or alternatively, the data storage system 2040 may be formed as a stand alone unit independent of a host computer. Moreover, certain features of the present invention are not limited to the use of data storage systems and may be utilized in many other electronic circuits that have varying current demands.

Figure 3:
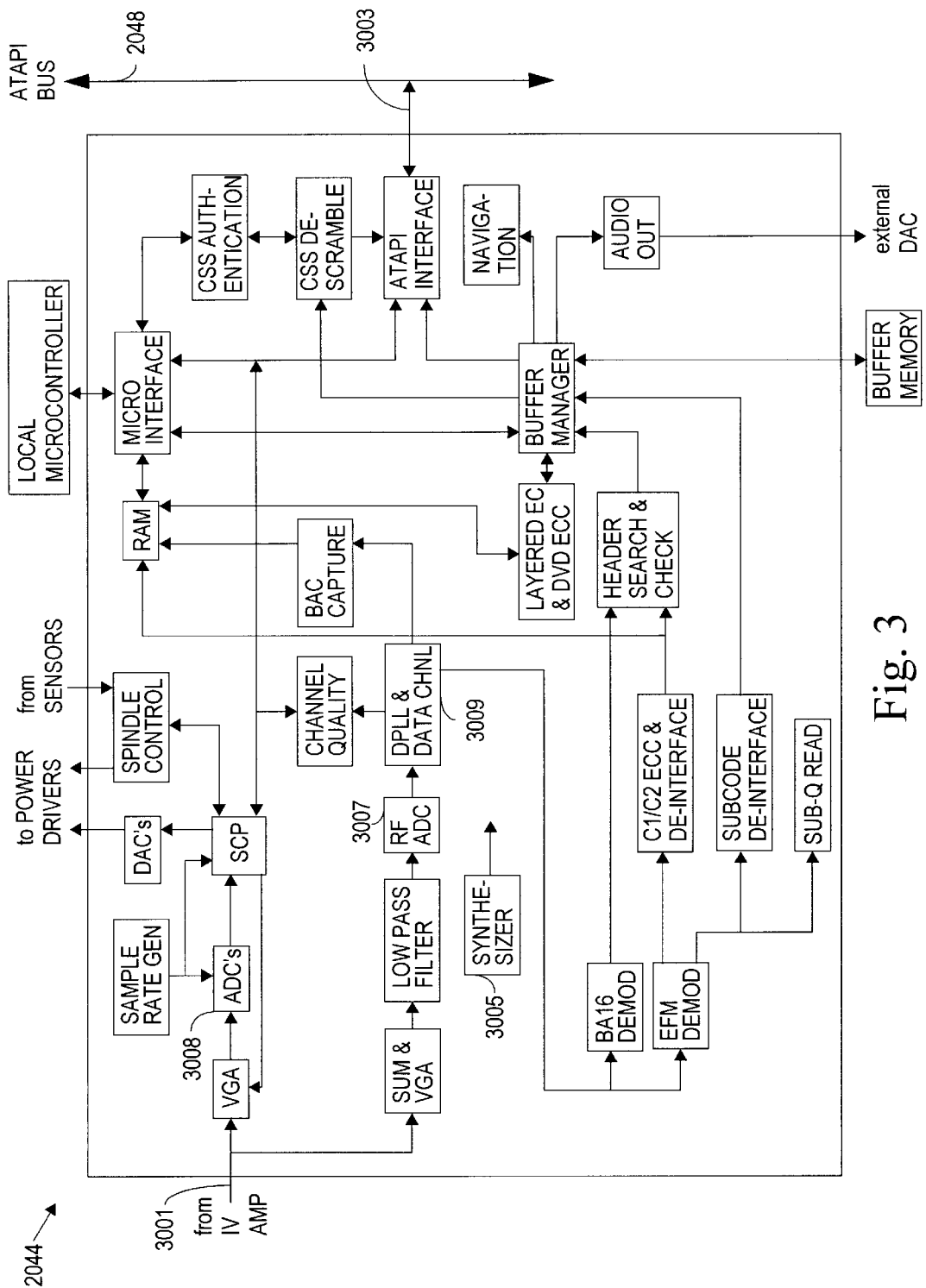
FIG. 3 is a block diagram of a data detection controller circuit.

FIG. 3 shows one exemplary embodiment of a data detection circuit 2044. As shown in FIG. 3, the data detection circuit 2044 may include a data input 3001 which may be coupled to an optical pickup head and may include a data output 3003 which may be coupled to an ATAPI bus 2048. The data detection circuit 2044 may also include a frequency synthesizer 3005 which may provide clock signals to the various circuit elements such as the read path ADC 3007, the servo path, data channel circuitry 3009, the servo path ADC 3008, and the other circuitry shown in FIG. 3 which may include various data recovery circuits such as decimation filters, equalizer circuits, offset and gain control circuits, decoder circuits, digital PLL circuits, etc. The output of the frequency synthesizer may also be provided as a clock to other types of circuits which require a clock signal as it will be recognized that the frequency synthesizer disclosed herein may be utilized with a wide range of circuits.

Figure 4:
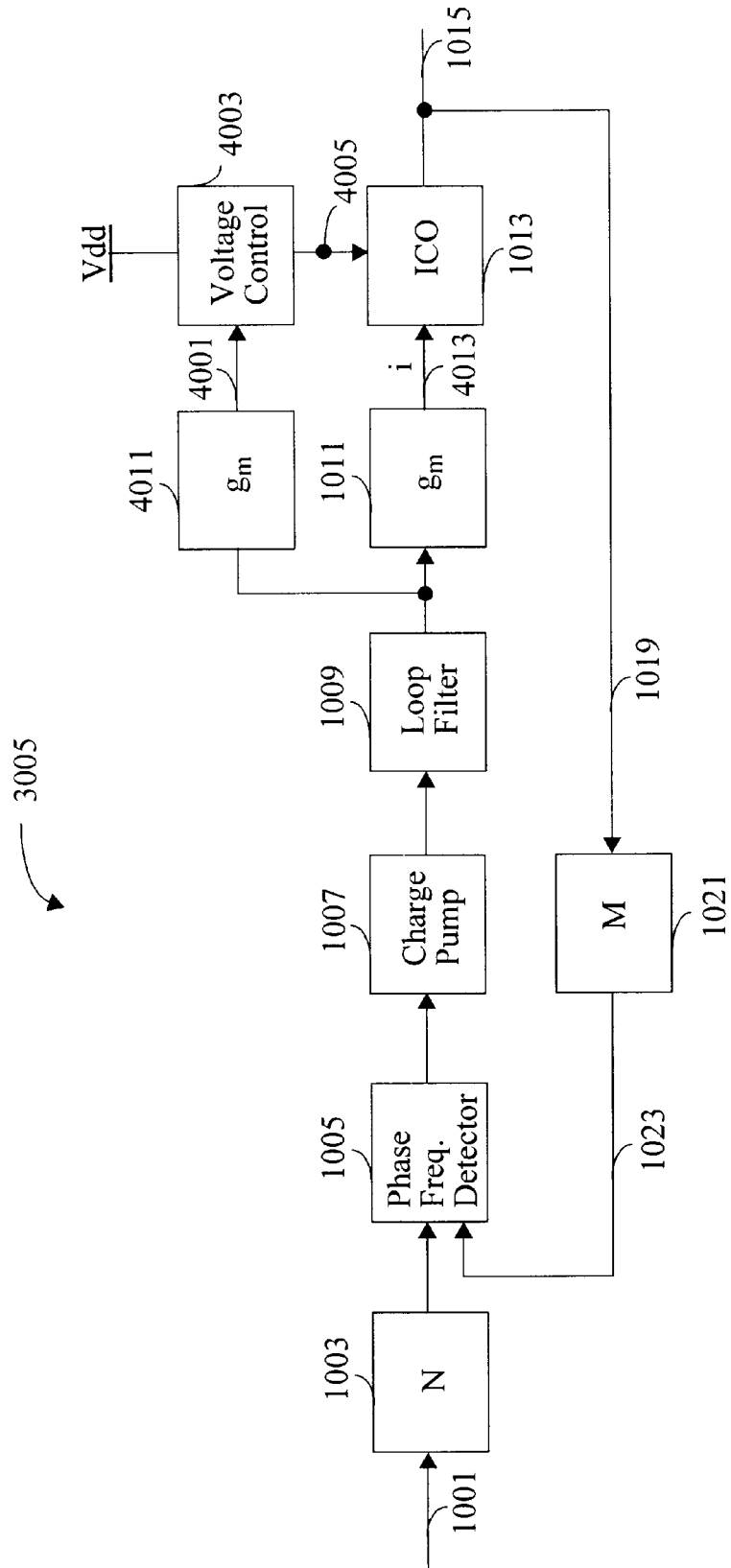
FIG. 4 is a block diagram of a frequency synthesizer according to the present invention.

FIG. 4 shows a frequency synthesizer 3005 according to one embodiment of the present invention. As shown in FIG. 4, the frequency synthesizer 3005, a frequency synthesizer 1000 may be a phase locked loop (PLL) which may include a current controlled oscillator (ICO) 1013 and a reference clock input signal 1001. The phase locking loop is completed by feeding back the output of the oscillator to a phase/frequency detector which also receives the reference clock signal. More particularly, the reference clock 1001 is provided to a divider circuit 1003 which divides the reference clock signal by a value of N. The output of the divider 1003 is provided as one input to the phase/frequency detector 1005. The output of the phase/frequency detector is provided to a charge pump 1007 which in turn provides an output to a loop filter 1009. The voltage output of the loop filter 1009 is provided to transconductance stage 1011 which converts the voltage output of the loop filter to a current output. The transconductance stage 1011 has an output which is provided as the current control ($i_{control}$) signal 4013 to the current controlled oscillator 1013. The current controlled oscillator is also coupled to a ICO power supply node 4005 which may be, for example, a voltage supply node. The output 1017 of the current controlled oscillator 1013 is provided as an output clock and also utilized in a feedback loop which is provided to the divider 1021 which divides the output 1017 by M. The output 1023 of the divider 1021 is then provided as the second input to the phase/frequency detector 1005.

The divider circuits 1003 and 1021, the phase/frequency detector 1005, the charge pump 1007, the loop filter 1009, the transconductance stage 1011 and the controlled oscillator 1013 may be any of a wide variety of standard circuits. For example, the M and N dividers 1021 and 1003 may be programmable digital counters that provide an output clock whose frequency is the input clock frequency divided by M or N respectively. The counter counts M or N pulses of the input clock and outputs a single pulse at the output. The phase/frequency detector 1005 compares the outputs of the divide by M circuit 1021 and the divide by N circuit 1003 to provide an output that is proportional to the phase and frequency error between the two inputs to the detector. When the PLL is settled, the outputs of the divide by M circuit 1021 and the divide by N circuit 1003 have the same frequency and the same phase (i.e., the edges of the two clocks are in line with each other). When the two signals are not in phase, the phase/frequency detector 1005 provides an UP or DOWN signal to the charge pump 1007 to enable the oscillator to speed up or slow down. The charge pump 1007 converts the digital UP or DOWN signals from the phase/frequency detector 1005 and converts the signals into a current that serves to modulate voltages up or down in the loop filter 1009.

The current from the charge pump either charges or discharges a resistor-capacitor network in the loop filter 1009. When the PLL is settled, the voltages in the resistor-capacitor network do not change since the output of phase/frequency detector is zero and the charge pump does not provide any output current. The output of the loop filter is a voltage that is converted to a current by the transconductance stage 1011. The transconductance stage 1011 has an output that is a current signal 4013 that controls the current controlled oscillator 1013. The current controlled oscillator 1013 has an output frequency that is a function of its input current. Since the PLL may have a wide range of operating frequencies, capacitors in the oscillator may be switched in to slow down the oscillator to center the oscillator to a given frequency range for the same control current range.

As shown in FIG. 4, the output of the loop filter 1009 is provided not only to the transconductance stage 1011 but is also fed forward to a voltage control circuit 4003 through a second transconductance stage 4011 and a duplicate control signal 4001. The ICO supply node 4005 is provided as an output of the voltage control circuit 4003 and provides a voltage supply for the ICO 1013. The current drawn by the ICO 1013 from the supply node 4005 will change as the control current input 4013 to the ICO 1013 (i.e., the control current provided as an output of the transconductance stage 1011) changes. Thus, the frequency synthesizer 3005 of FIG. 4 provides a control signal 4001 to the voltage control circuit 4003 so that the current supplied from the voltage control circuit 4003 may be adjusted in real time as the current demands of the ICO 1013 are also changing. With this feed forward technique, a more stable voltage may be obtained at the voltage node 4005 even when the ICO 1013 exhibits a large variation in the current demands from the power supply. By utilizing a feed forward control, the system shown herein provides stable voltage control even when high frequency phase noise is being introduced beyond the bandwidth of the voltage regulator within the voltage control circuit.

Though not necessary, it may be desirable to form the transconductance stage 1011 and the transconductance stage 4011 as identical circuits in order for the control signal 4001 provided to the voltage control circuit 4003 to more accurately mimic the control signal 4013 provided to the ICO 1013. However, transconductance stage 4011 is not required for use since the voltage control circuit 4003 may be configured for accepting a voltage input signal rather than a current input signal.

Figure 5:
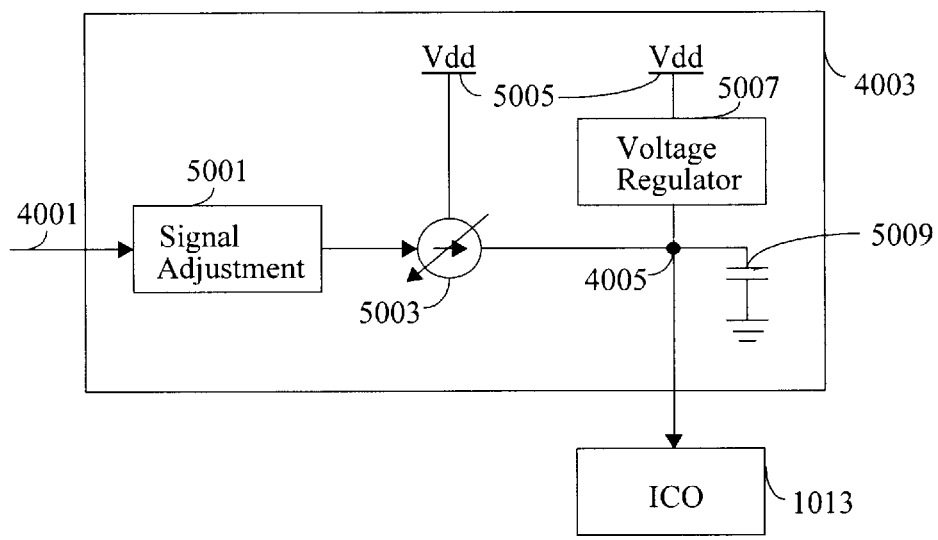
FIG. 5 is a block diagram of one embodiment of a voltage control circuit according to the present invention.

The voltage control circuit 4003 of FIG. 4 may be seen with more detail in FIG. 5. More particularly, with reference to FIG. 5, the voltage control circuit 4003 receives as an input signal the control signal 4001. The control signal 4001 is provided to a signal adjustment circuit 5001. The signal adjustment circuit 5001 may be utilized to provide gain and/or offset adjustments to the control signal. The output of the signal adjustment circuit 5001 may be provided to a variable supply 5003. In a preferred embodiment, the variable supply 5003 may be a variable current supply. The variable current supply 5003 may be connected to a power supply rail 5005 (Vdd). The output of the variable current supply 5003 is coupled to the ICO supply node 4005. The ICO supply node is also coupled to a voltage regulator 5007, a capacitor 5009, and the ICO 1013 as shown in the FIG. 5. The voltage regulator 5007 is also coupled to the voltage supply rail Vdd 5005. Depending on the nature of the control signal 4001, the signal adjustment circuitry 5001 may not, however, be required in order to obtain the benefits of the present invention. Further, though the voltage regulator, current supply, and signal adjustment circuit are shown herein as comprising a single voltage control circuit, it will be recognized that this circuit elements may be formed as separate circuit elements or more may formed as one larger circuit element which includes the functionality of the various elements as disclosed herein.

The circuit of FIG. 5 operates to stabilize the voltage at the ICO supply node 4005 even when the current the ICO pulls through the ICO supply node 4005 varies widely. In particular, as the current control input 4013 to the ICO 1013 changes (and thus the current demands of the ICO 1013 change), the control signal 4001 will also change. The voltage at the ICO supply node 4005 is initially set by the voltage regulator 5007. As changes in the control signal 4001 occur, the variable current source 5003 may be adjusted in order to meet the current demand changes required by the ICO 1013. In this manner, the variations in the supply current demands of the ICO 1013 may be met by the variable current supply 5003 instead of being drawn from the voltage regulator 5007. Thus, the output current drawn from the voltage regulator 5007 remains relatively constant. Because the current output of the voltage regulator 5007 remains relatively constant, the voltage regulator 5007 is able to more accurately maintain a stable voltage at the ICO supply node 4005.

Thus, the variations in supply current required by the ICO are not met by the voltage regulator 5007 as in the prior art but rather are supplied by the variable current source 5003 through the feed forward control path. Furthermore, the additional current supply may be controlled in real time through a control signal which bears a relationship to the ICO input control signal.

Figure 5A:
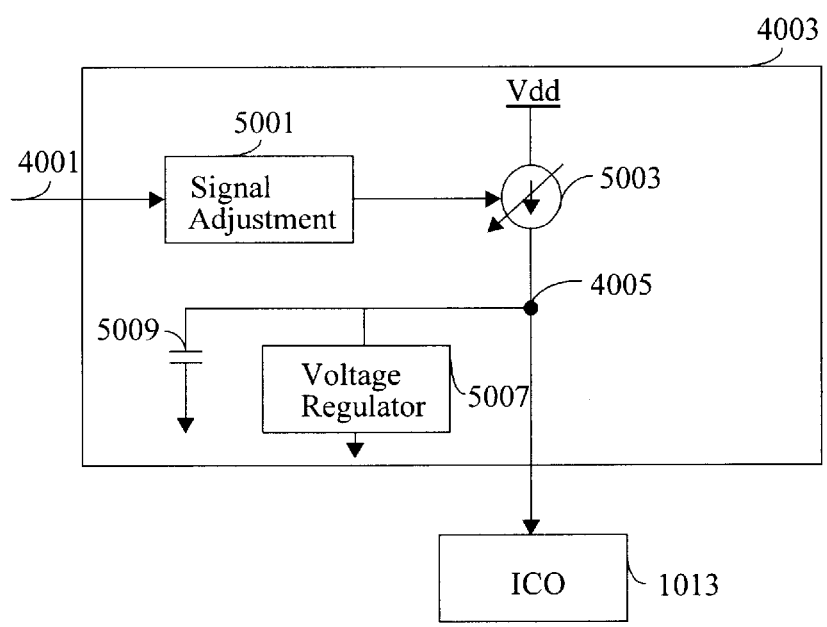
FIG. 5A is a block diagram of one embodiment of a voltage control circuit according to the present invention.
Figure 6:
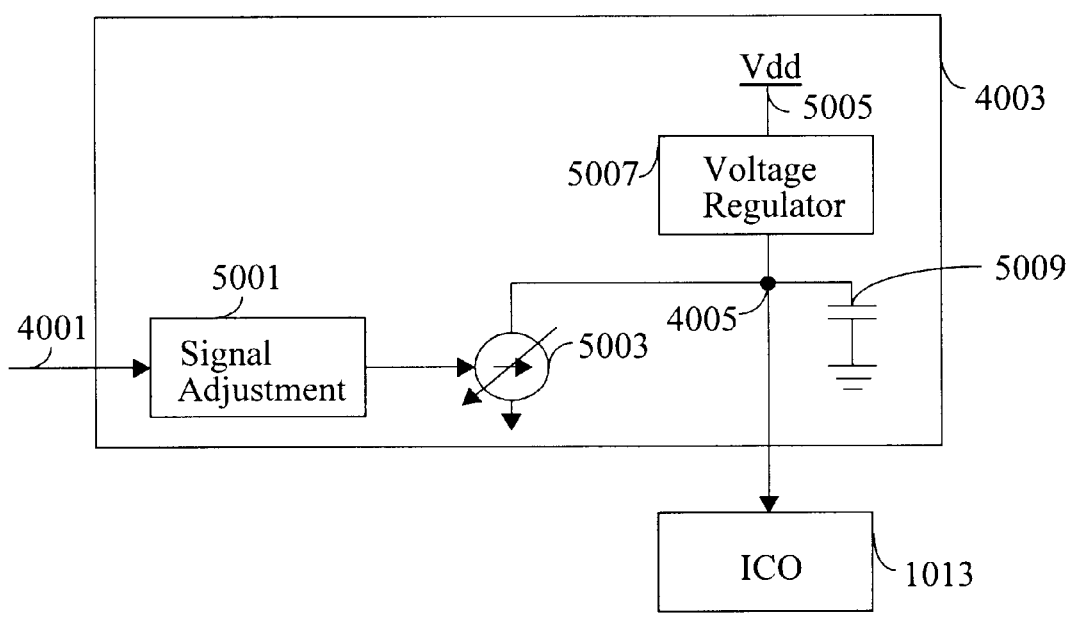
FIG. 6 is a block diagram of another embodiment of a voltage control circuit according to the present invention.

The embodiment of FIG. 5 illustrates an example in which a variable current supply 5003 is utilized to add current to the ICO supply node 4005. Thus, the voltage regulator may be designed to supply the minimum current needed by the ICO with any additional current supplied from the variable current source. In this manner the current output of the voltage regulator remains relatively constant. It will be recognized, however, that the invention may be utilized in other manners. For example, as shown in FIG. 5A, a variable current supply 5003 is still utilized to add current to the ICO supply node 4005 similar to that as shown in FIG. 5. However, as shown in FIG. 5A, the voltage regulator may be coupled to ground rather than Vdd. Further, as shown in FIG. 6, the variable current supply 5003 may be utilized as a variable current sink. In this manner, the voltage regulator 5007 may be designed to provide a stable voltage at the ICO supply node 4005 when the voltage regulator 5007 is supplying the maximum current that the ICO 1013 may draw. Thus, when the current demands of the ICO 1013 are lessened, the variable current supply 5003 may sink the additional current necessary to maintain a relatively constant current output from the voltage regulator. In this manner, the voltage at the ICO supply node 4005 as regulated by the voltage regulator 5007 will maintain a relatively stable value even though the current supply demands of the ICO 1013 may change widely.

The voltage regulation circuit 5007 such as shown in FIGS. 5, 5A, and 6 may utilize feedback control in order to regulate the voltage at node 4005. In the examples shown in FIGS. 5, 5A and 6, the feed forward control signal is provided to control circuitry within the voltage control block 4003 which also impacts node 4005. It will be recognized, however, that the feed forward control signal 4001 may be provided in other manners to the voltage control block 4003. For example, the feed forward control signal 4001 may be provided directly to the voltage regulator 5007, such as for example, by providing the feed forward control signal directly to the feedback regulation control loop of the voltage regulator. In such embodiments, what is shown in FIG. 4 as a voltage control circuit 4003 may be comprised solely of a voltage regulation circuit which directly receives the feed forward control.

Figure 7:
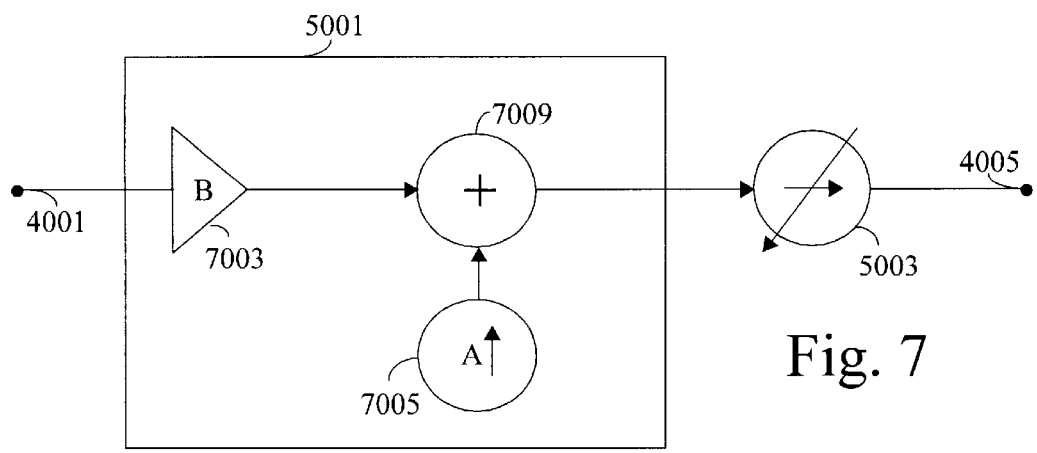
FIG. 7 is a block diagram of one embodiment of a signal adjustment circuit according to the present invention.
Figure 7A:
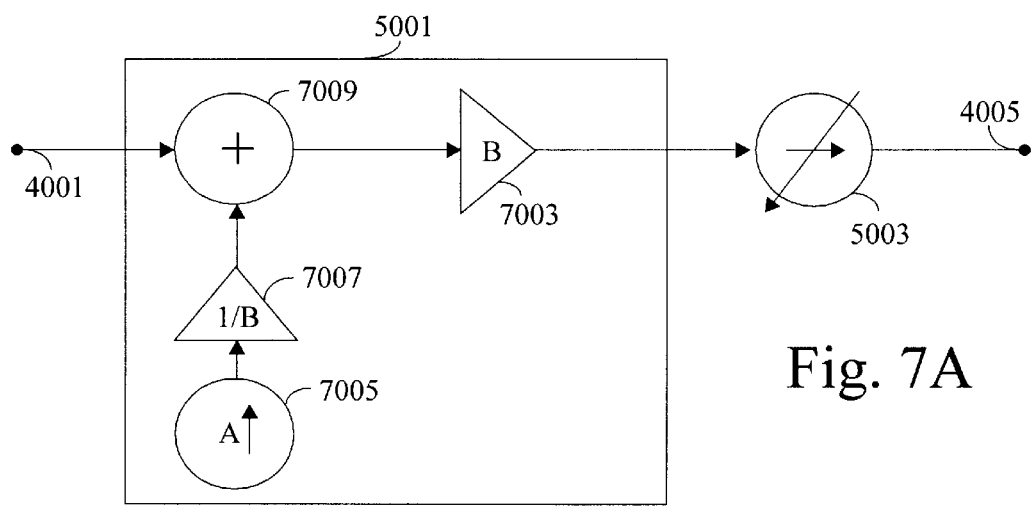
FIG. 7A is a block diagram of another embodiment of a signal adjustment circuit according to the present invention.

Thus, as shown above the control information which is provided to the controlled oscillator may also be provided to a power supply control circuit in order to provide an improved controlled oscillator performance. The relationship between the control signal 4001 and the current demand of the controlled oscillator 1013 may be approximated with a first order linear approximation and thus the current demand may be represented as $f(x)=A+B(i_{control})$ Utilizing such an approximation, the signal adjustment circuit 5001 may be represented as shown in FIG. 7. More particularly, the signal adjustment circuit 5001 may include a current amplifier 7003 to provide an amplification of B and a current source to provide an offset current source 7005 having a value of A as shown in the equation above. The control signal 4001 may be provided to the amplifier 7003 and the output of the amplifier 7003 provided to a current summer 7009. The current summer 7009 also receives the current from the current source 7005. The output of the current summer 7009 is the summation of the outputs of the amplifier 7003 and the current source 7005 and is provided to the variable current source 5003. In this mainer, a control signal may be provided to the variable current source 5003 in order to provide the appropriate current adjustment such that the current flowing through the voltage regulator 5007 remains approximately constant. It will be recognized, that the principles of the present invention may be obtained by using a wide variety of signal adjustment schemes. For example, FIG. 7A shows such an alternative approach. As shown in FIG. 7A the offset current A from the current source 7005 may be added to the control signal current 4001 with the current summer 7009 prior to the amplifier 7003. In such an embodiment, an amplifier 7009 may be utilized to reduce the current from the current source 7005 by a factor of 1/B to account for the placement of the current source 7005 prior to the amplifier 7003 so that the linear approximation described above is still utilized.

Figure 7B:
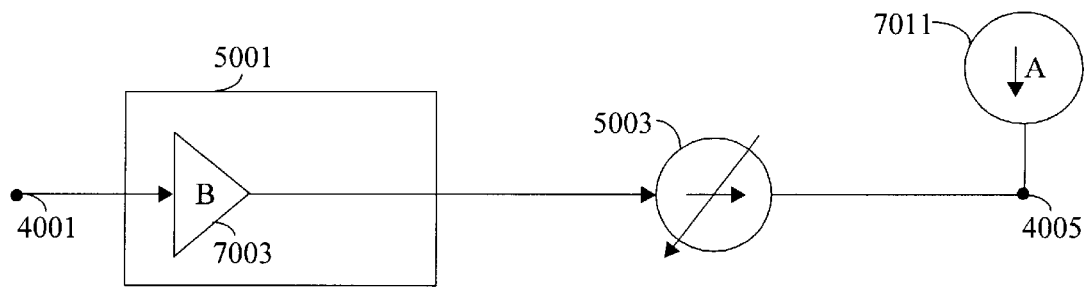
FIG. 7B is a block diagram of another embodiment of a signal adjustment circuit according to the present invention.

Many other signal adjustment configurations (or none at all) may also be utilized. As shown in FIG. 7B, the control signal adjustment circuit 5001 may include an amplifier 7003 (having a gain of B). Further, as shown in FIG. 7B, a constant current source 7011 may be provided directly to the ICO supply node 4005 in order to complete the linear approximation of the current demand of the ICO versus the ico, current. Though shown herein with linear approximations, the control concepts of the present invention are not limited to linear approximations and other approximations may be utilized.

Figure 8:
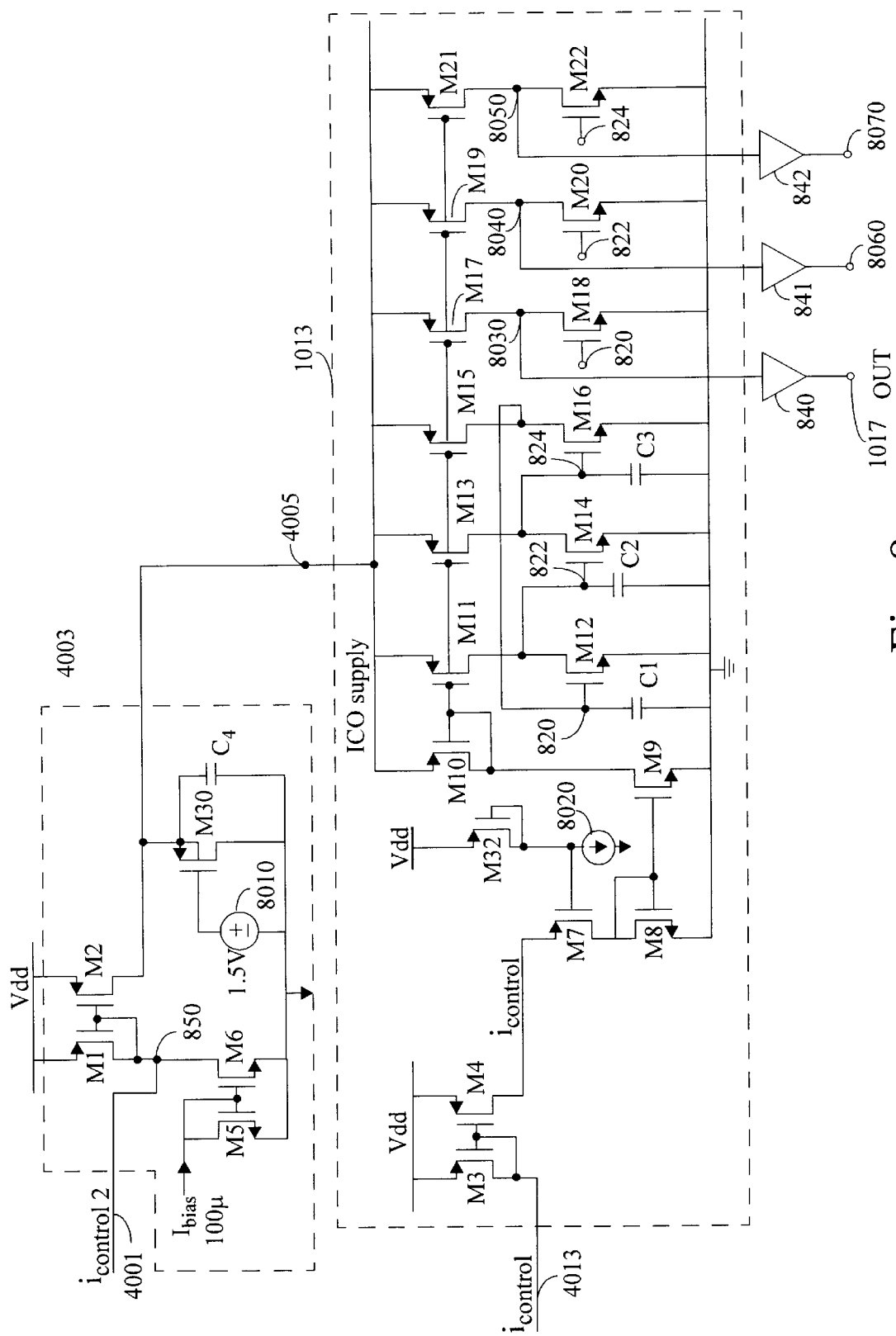
FIG. 8 is a schematic of one embodiment of a voltage control circuit and a current controlled oscillator according to the present invention.

A circuit schematic for implementing the techniques disclosed herein (with particular reference to the embodiments shown in FIGS. 5A and 7A) is illustrated in FIG. 8. As shown in FIG. 8, the voltage control circuit 4003 receives the $i_{Control2}$ signal 4001 which may be provided from a transconductance stage 4011 as shown in FIG. 4. With reference again to FIG. 8, the output of the voltage control circuit 4003 is the ICO supply node 4005. The voltage control circuit 4003 includes two transistors M1 and M2 through which both a constant current source (A term) and the proportional current source (B term) are provide to the ICO supply node 4005. More particularly, a constant current $I_{bias}$ (A term) may be coupled to transistors M5 and M6 as shown. The current $I_{bias}$ may be, for example, a 100 μA current that is a relatively temperature independent current provided from a temperature compensated bandgap circuit. Current mirror transistors M5 and M6 form a current mirror which amplifies the current $I_{bias}$ (A term) by a factor of 1/B. The current at the drain of transistor M6 (A/B) is then added to the $i_{control2}$ current at node 850. The current at node 850 is then amplified by a factor of B with the current mirror transistors M1 and M2.

Transistor M30, capacitor $C_4$, and voltage source 8010 form a sinking voltage regulator. As shown, transistor M30 is coupled to the ICO supply node 4005 as is capacitor $C_4$. The voltage source 8010 may be, for example, a 1.5 V temperature independent voltage generated using a bandgap voltage and resistor derived current through another resistor in parallel with a high frequency capacitive path to ground to reduce high frequency noise. Transistor M30 is a source follower that holds the voltage on the ICO supply node 4005. The capacitor $C_4$ provides a high frequency path to ground to reduce the high frequency noise on the ICO supply node 4005.

As further shown in FIG. 8, the ICO 1013 receives the $i_{control}$ signal 4013 which may be provided from the transconductance stage 1011 as shown in FIG. 4. With reference again to FIG. 8, transistors M3, M4, M8, and M9 are provided as current mirrors that deliver the $i_{control}$ current 4013 to the ring of the current starved inverters that form the oscillator of the ICO. Transistor M7 is a cascode device utilized to improve the power supply rejection of the current mirrors M3, M4, M8, and M9. Transistor M7 is maintained in saturation by keeping the gate of transistor M7 at a constant voltage provided by transistor M32 and current source 8020. Transistors M10-M22 form current starved inverters of the current control oscillator. The gates of transistors M18, M20 and M22 are connected to the nodes 820, 822, and 824 respectively as are the gates of transistors M12, M14, and M16. Capacitors $C_1$, $C_2$, and $C_3$ set the range of the oscillator's frequency. Replicas of the signals in the three phases of the ICO 1013 may be provided at nodes 8030, 8040, and 8050. These nodes may be connected to level shifter circuits 840, 841, and 842 which shift the voltages to Vdd (from the ICO supply voltage) to provide the ICO output 1017 and dummy nodes 8060 and 8070. Level shifters 841 and 842 and dummy nodes 8060 and 8070 are provided so as to match the loads at each phase node. Alternatively, three phase outputs could be obtained from the oscillator if desired. It will be recognized that the present invention is not limited to three phase oscillators and may be utilized with many different oscillators.

The control of a the power supply of a controlled oscillator concepts disclosed herein may be utilized with a wide variety of oscillators and frequency synthesizers. One embodiment may be utilized for generating clock signals for a data detection circuit, and more particularly a data detection circuit for reading data from an optical disk. In such an embodiment, the reference clock input signal 1001 may be provided as a 16.9344 MHz or 33.8688 MHz signal. The frequency synthesizer output 1017 may be 237.0816 MHz. When the 33.8688 MHz signal is utilized as an input, the loop divisor N of the divider 1003 may be set at 2, and when the 16.9344 MHz signal is utilized as an input, the loop divisor N of the divider 1003 may be set at 1. The loop divisor M of the divider 1021 may then be set at 14. Frequencies in addition to 237.0816 MHz may then be obtained, if desired, by dividing the synthesizer output 1017 with divide by 2, divide by 3, divide by 4 etc. circuits (not shown).

In optical disk usage, the variations in the control current ($i_{control}$) 4013 presented to the ICO 1013 may typically range from 20 μA to 200 μA. Further, the current demand the ICO 1013 places on the supply which results may typically range from 1 mA to 10 mA. By utilizing the techniques disclosed herein, voltage at the ICO supply node may be held relatively constant even when the ICO current demand exhibits such a wide variation. For example, the voltage range at the supply node may be 50 mV or less for a 1 mA to 10 mA current demand.

Though shown herein with respect to a current controlled oscillator, it will be recognized that the concepts of the present invention may be utilized with other controlled oscillators. Thus, for example, the present invention may be utilized with a voltage controlled oscillator. In such an embodiment the voltage output of a loop filter may be provided directly to both a controlled oscillator and a voltage control circuit. In this manner, a signal from the phase locked loop is still provided to the voltage control circuit as an indicator of the changed demands that the controlled oscillator will place on the power supply. It will also be recognized that although the exemplary embodiments are shown herein with reference to a voltage regulated power supply, the concepts of using the phase locked loop information to control the power supply may also be utilized with a current regulated supply.

In addition, though the present invention has been shown with an illustrative embodiment wherein control information is obtained from the phase locked loop after the loop filter, it will be recognized that the control information may be obtained at any number of points within the loop. For example, control data may be obtained after the phase frequency detector 1005, after the charge pump 1007 or after the transconductance stage 1011. The processing of the control data prior to presentation of that data to the voltage control circuitry may, however, be modified depending upon where within the loop the data is obtained from. Thus, it is merely desirable to provide control information to an oscillator power supply that is indicative of changes occurring within the phase locked loop so that changing power supply demands of the oscillator may be compensated.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method of operating a data detection circuit, comprising:

generating a clock signal from a frequency synthesizer, the frequency synthesizer including a phase locked loop, the phase locked loop including a controllable oscillator;

coupling the controllable oscillator to a power supply node;

controlling the power supply node with a power supply control circuit;

providing a control signal from the phase locked loop to the power supply control circuit; and controlling a current provided to or from the power supply node to counteract a current demand change of the controllable oscillator.

2. The method of claim 1, the providing step further comprising utilizing the control signal to provide feed forward control to the power supply control circuit.

3. The method of claim 2, the power supply node being a voltage node.

4. The method of claim 2, the controllable oscillator being a current controlled oscillator, and the control signal being indicative of a current input control signal that controls the current controlled oscillator.

5. The method of claim 4, the current provided to or from the power supply node being supplied or sunk from the power supply node by a variable current source, the variable current source being controlled by the control signal.

6. A method of operating a data storage system, comprising:

transmitting a data signal from a data storage medium to a data detection circuit;

generating, within the data detection circuit, a clock signal from a phase locked loop, the phase locked loop including a controllable oscillator;

providing a power supply to the controllable oscillator;

controlling the power supply with a feed forward control signal from the phase locked loop so as to regulate the power supply and to provide a more accurate clock signal by controlling a current supplied to the controllable oscillator; and processing the data signal with at least one circuit within the data detection circuit, the at least one circuit being clocked by the clock signal.

7. The method of claim 6, the controllable oscillator being a current controlled oscillator.

8. The method of claim 7, the controllable oscillator placing a varying current demand upon the power supply.

9. The method of claim 6, the data storage medium being an optical disk.

10. The method of claim 6, the controlling step further comprising adding or removing current to a supply node of the power supply so as to maintain a more constant voltage at the supply node.

11. A method of operating a frequency synthesizer, comprising:

forming a phase locked loop;

regulating a power supply provided to a controllable oscillator of the phase locked loop;

generating a power supply control signal from the phase locked loop; and adjusting the regulation of the power supply with the power supply control signal by controlling a current to counteract a current demand change of the controllable oscillator.

12. The method of claim 11, further comprising providing the power supply control signal as a feed forward control signal to the power supply.

13. The method of claim 11, the controllable oscillator being a current controlled oscillator.

14. The method of claim 13, the power supply control signal being representative of the current input control signal of the current controlled oscillator.

15. The method of claim 13, the current controlled oscillator placing varying current demands upon the power supply.

16. The method of claim 15, the adjusting step further comprising adding or removing current from a power supply node so as to improve the voltage regulation of the power supply node, the power supply node being coupled to the current controlled oscillator.

17. The method of claim 11, the power supply circuit comprising a voltage regulator circuit.

18. The method of claim 17, the power supply circuit further comprising a variable current source, the adjusting step further comprising varying a current output of the variable current source.

19. The method of claim 11, the power supply control signal being indicative of an input control signal that controls the controllable oscillator.

20. A method of operating a circuit, the circuit having a varying current demand at a voltage supply node, the method comprising:

coupling the circuit to the voltage supply node;

generating within the circuit a varying current demand at the voltage supply node, the varying current demand dependent upon a circuit control signal;

controlling the voltage at the voltage supply node with a voltage supply control circuit;

providing a feed forward control signal to the voltage supply control circuit, the feed forward control signal bearing a relationship to the circuit control signal;

controlling the voltage supply control circuit with the feed forward control signal; and controlling a current provided to or from the power supply node to counteract the current demand change of the circuit.

21. The method of claim 20, the feed forward control signal being approximately the same as the circuit control signal.

22. The method of claim 21, controlling step further comprising adding or removing a current from the voltage supply node in response to the voltage supply control circuit.

23. A data detection circuit for processing data from a data storage medium, comprising:

a phase locked loop;

a clock signal generated by the phase locked loop, the clock signal utilized to clock at least one circuit of the data detection circuit;

a controllable oscillator within the phase locked loop, an output of the controllable oscillator providing the clock signal;

a power supply node coupled to the controllable oscillator;

a power supply control circuit coupled to the power supply node; and a control signal generated from the phase locked loop, the control signal coupled to the power supply circuit to control a current at the power supply node.

24. The data detection circuit of claim 23, the power supply control circuit comprising a voltage regulator.

25. The data detection circuit of claim 24, the power supply control circuit further comprising a variable current source.

26. The data detection circuit of claim 23, the controllable oscillator being a current controlled oscillator.

27. The data detection circuit of claim 26, the current controlled oscillator placing varying current demands upon the power supply node.

28. The data detection circuit of claim 27, the power supply control circuit further comprising a variable current source to add or remove current from the power supply node in response to the control signal.

29. A frequency synthesizer, comprising:

a phase locked loop;

a controllable oscillator within the phase locked loop, an output of the controllable oscillator providing the phase locked loop output;

a first control signal coupled to the controllable oscillator for controlling the controllable oscillator;

a power supply node coupled to the controllable oscillator;

a power supply control circuit coupled to the power supply node; and a power supply control signal generated from the phase locked loop, the power supply control signal being indicative of the first control signal to control a current provided to or from the power supply node to counteract a current demand change of the controllable oscillator.

30. The frequency synthesizer of claim 29, the power supply control signal being a feed forward control signal.

31. The frequency synthesizer of claim 30, the power supply control circuit comprising a voltage regulator.

32. The frequency synthesizer of claim 31, the power supply control circuit further comprising a variable current source.

33. The frequency synthesizer of claim 30, the controllable oscillator being a current controlled oscillator.

34. The frequency synthesizer of claim 33, the current controlled oscillator placing a varying current demand upon the power supply node.

35. The frequency synthesizer of claim 34, the power supply control circuit comprising a voltage regulator and a variable current source.

* * * * *